US006245476B1

(12) United States Patent

Kodama et al.

(10) Patent No.: US 6,245,476 B1

(45) Date of Patent: Jun. 12, 2001

(54) PHOTO-SENSITIVE AND HEAT-SENSITIVE RECORDING MATERIAL

(75) Inventors: Tomohiro Kodama; Yohsuke Takeuchi; Kimiatsu Nomura; Yoshihiro Jimbo; Ken Iwakura, all of Shizuoka-ken (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 09/328,489

(22) Filed: Jun. 9, 1999

(30) Foreign Application Priority Data

Jul. 2, 1998 (JP) ..................... 10-187783

(51) Int. Cl.$^7$ ..................... G03F 7/016; G03C 1/72

(52) U.S. Cl. ..................... 430/138; 430/157; 430/163; 430/183; 430/185; 430/186

(58) Field of Search ..................... 430/138, 157, 430/183, 185, 186, 163

(56) References Cited

U.S. PATENT DOCUMENTS

| | | | | |
|---|---|---|---|---|
| 3,944,423 | * | 3/1976 | Frommeld et al. | 430/185 |
| 5,213,939 | * | 5/1993 | Sugiyama et al. | 430/138 |
| 5,296,329 | * | 3/1994 | Sugiyama et al. | 430/138 |
| 5,543,260 | * | 8/1996 | Tateishi et al. | 430/138 |
| 5,683,850 | * | 11/1997 | Matushita et al. | 430/138 |
| 5,998,082 | * | 12/1999 | Jimbo et al. | 430/138 |
| 6,017,672 | * | 1/2000 | Arai et al. | 430/138 |

FOREIGN PATENT DOCUMENTS

| | | | |
|---|---|---|---|
| 64-80588 | 3/1989 | (JP) | B41M/5/18 |
| 4-59288 | 2/1992 | (JP) | B41M/5/30 |
| 4-197782 | 7/1992 | (JP) | B41M/5/30 |
| 8-310133 | 11/1996 | (JP) | B41M/5/30 |

* cited by examiner

*Primary Examiner*—John S. Chu

(74) *Attorney, Agent, or Firm*—Sughrue, Mion, Zinn, Macpeak & Seas, PLLC

(57) ABSTRACT

The present invention provides a photo-sensitive and heat-sensitive recording material comprising a substrate supporting thereon a photo-sensitive and heat-sensitive recording layer containing a diazo compound and a coupler, wherein the diazo compound is a compound represented by the following general formula (1) and the diazo compound is enclosed in a microcapsule:

General formula (1)

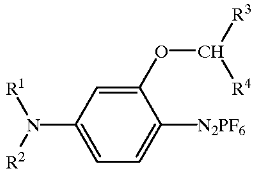

wherein, $R^1$ and $R^2$ may be the same or different, and represent an alkyl group having 1 to 5 carbon atoms; $R^1$ and $R^2$ may be bonded to each other to form a ring; $R^3$ and $R^4$ may be the same or different, and represent an alkyl group; and $R^3$ and $R^4$ may be bonded to each other to form a ring. This photo-sensitive and heat-sensitive recording material reveals less change in the base concentration between before and after storage before use.

12 Claims, No Drawings

PHOTO-SENSITIVE AND HEAT-SENSITIVE RECORDING MATERIAL

BACKGROUND OF THE INVENTION

1. Field of the Invention

The present invention relates to a photo-sensitive and heat-sensitive recording material using a diazo compound and a coupler as color developing components, and more particularly, relates to a photo-sensitive and heat-sensitive recording material of a yellow to blue color developing type that is excellent in terms of virgin stock storability and manifests high concentration of color generation in heat recording. Further, the present invention relates to a photo-sensitive and heat-sensitive recording material having high photo-sensitivity with respect to light of relatively short wavelengths (350 nm to 390 nm) within an ultraviolet ray range.

2. Description of the Related Art

A diazo compound is a compound having extremely high chemical activity, and reacts with a so-called coupler comprising a phenol derivative or an active methylene group, to form an azo dye easily. A diazo compound also has photo-sensitivity, and is decomposed by irradiation to lose its activity.

Therefore, diazo compounds have been conventionally used as light recording materials as represented by diazo copy (see "Shashinkogaku no kiso—Higinen Shashin Hen (Fundamentals of Photographic Engineering—Non-Silver Salt Photography Section)", pp. 89 to 117, 182 to 201, edited by the Photographic Society of Japan, Corona Publishing Co., Ltd., 1982).

Further, recently, diazo compounds are also applied for recording materials requiring fixation of an image, thus utilizing its nature wherein it is decomposed and loses activity by an action of a light. As a typical example, there has been proposed a light fixation type heat-sensitive recording material wherein a diazo compound and a coupler are heated according to image signals to be reacted to form an image, and then the image is fixed by irradiation (Hirotsugu Sato et al., Bulletin of the Image Electronics Society, vol.11, No.4, (1982), pp. 290 to 296, and the like).

However, this recording material using a diazo compound as a color developing element has a defect wherein shelf life thereof as a recording material is short since the activity of the diazo compound is very high and the diazo compound is thermally decomposed gradually to lose its reactivity even in dark places.

There are various methods suggested as a means for improving instability of the diazo compounds, and as one of the most effective means, a method in which a diazo compound is enclosed in a microcapsule may be listed.

As described above, the diazo compound is insulated from materials promoting decomposition such as water, a base and the like by being enclosed in the microcapsule. Therefore, the decomposition thereof is remarkably suppressed and shelf life of a recording material using this increases greatly (Tomomasa Usami et al., Bulletin of the Electronic Photography Society, vol. 26, No. 2, (1987), pp. 115 to 125).

In a general method for enclosing a diazo compound in a microcapsule, the diazo compound is dissolved in a hydrophobic solvent (oil phase), the resultant solution is added to an aqueous solution (aqueous phase) into which a water-soluble polymer has been dissolved and is emulsified and dispersed by a homogenizer or the like, and at the same time, a monomer or prepolymer which will form a wall material of the microcapsule is added to the oil phase and/or the aqueous phase, to cause a polymerization reaction at an interface of the oil phase and the aqueous phase, or a polymer wall is formed by deposition of a polymer, thereby obtaining the microcapsule.

These methods are described in detail in, for example, Asashi Kondo, *Microcapsule* edited by Nikkan Kogyo Shinbun Publishing (published in 1970), Tamotsu Kondo et al., *Microcapsule* edited by Sankyo Shuppan (published in 1977), and the like.

As a material of the formed microcapsule wall, various materials such as crosslinked gelatin, alginate, celluloses, polyurea, polyurethane, melamine resin, nylon resin and the like can be used.

In a case of a microcapsule having a wall composed of a material with a glass transition temperature like a urea resin and urethane resin wherein the glass transition temperature is slightly higher than room temperature, this capsule is called a heat-responsive microcapsule and is useful for a heat-sensitive recording material since the capsule wall is impermeable with respect to materials at room temperature and is permeable with respect to materials at a temperature equivalent to or greater than the glass transition temperature thereof.

Namely, by producing the recording material comprising a substrate having applied thereto a photo-sensitive and heat-sensitive recording layer containing a coupler and a base and the heat-responsive microcapsule containing a diazo compound, the diazo compound can be kept in stable condition for a long period of time and a color developed image can be easily formed by heating, and further, an image can be fixed by irradiation.

As described above, stability of a diazo compound can be remarkably improved by enclosing the compound in a microcapsule.

However, even if the diazo compound is insulated from materials promoting decomposition such as water, a base or the like by being enclosed in a microcapsule, the diazo compound itself is unstable and is decomposed by the action of a light. Therefore, even if enclosure into a microcapsule is assumed, it is indispensable to stabilize the diazo compound itself.

Thus, the present inventors have conducted various investigations regarding a structure of a stable diazo compound. As a result, it has been found that a benzenediazonium salt having an alkoxy group or aryloxy group at an ortho position of a diazonio group is photosensitive with respect to a fixation light of a relatively short wavelength (350 nm to 390 nm) within the ultraviolet ray range and has improved heat stability in comparison with a benzenediazonium salt without an alkoxy group or aryloxy group at an ortho position of the diazonio group (Japanese Patent Application Laid-Open (JP-A) Nos. 64-80588, 4-59288, 4-197782).

However, even if these diazonium compounds are used, when they are used after being stored for a long period of time, base portions may sometimes become colored; therefore, further improvement has been desired for extending shelf life.

Accordingly, an object of the present invention is to provide a photo-sensitive and heat-sensitive recording material that has excellent virgin stock storability, provides a sufficiently high concentration of color generation in the resulting color developed image, and reveals high photo-sensitivity with respect to light of a relatively short wavelength (350 nm to 390 nm) within the ultraviolet ray range.

SUMMARY OF THE INVENTION

An object of the present invention have been accomplished by a photo-sensitive and heat-sensitive recording material comprising a substrate supporting thereon a photo-sensitive and heat-sensitive recording layer containing a diazo compound and a coupler, wherein the diazo compound is a compound represented by the following general formula (1) and the diazo compound is enclosed in a microcapsule:

General formula (1)

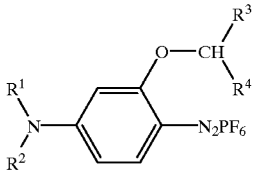

wherein, $R^1$ and $R^2$ may be the same or different, and represent an alkyl group having 1 to 5 carbon atoms; $R^1$ and $R^2$ may be bonded to each other to form a ring; $R^3$ and $R^4$ may be the same or different, and represent an alkyl group; and $R^3$ and $R^4$ may be bonded to each other to form a ring.

DESCRIPTION OF PREFERRED EMBODIMENT

A diazo compound represented by the general formula (1) will be described in detail below.

In the formula, an alkyl group represented by $R^1$ or $R^2$ is, for example, a methyl group, ethyl group, propyl group, butyl group, amyl group or the like.

In the formula, an alkyl group represented by $R^3$ or $R^4$ is, for example, a methyl group, ethyl group, propyl group, butyl group or pentyl group. As a group —$CHR^3R^4$, there are listed, for example, an isopropyl group, sec-butyl group, 2-pentyl group, 3-pentyl group, cyclopentyl group, 2-hexyl group, 3-hexyl group, cyclohexyl group, 2-heptyl group, 3-heptyl group, 4-heptyl group and the like. Secondary alkyl groups having 6 or less carbon atoms are preferable; specifically, an isopropyl group, 3-pentyl group, cyclopentyl group and cyclohexyl group are preferable.

Specific examples of the diazo compound represented by the general formula (1) include, but are not limited to, the following compounds.

A-1

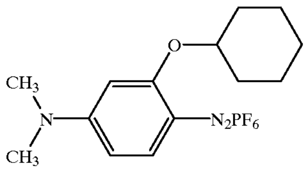

A-2

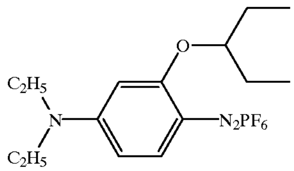

-continued

A-3

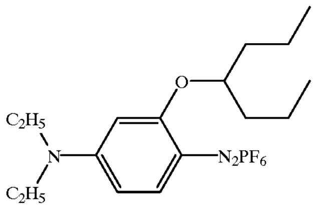

A-4

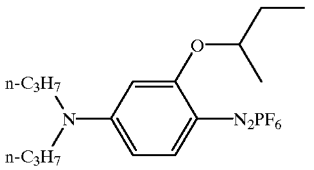

A-5

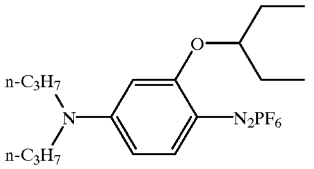

A-6

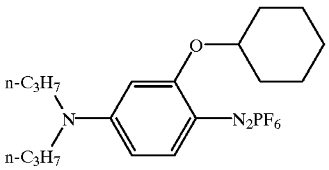

A-7

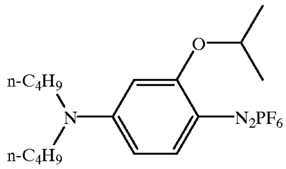

A-8

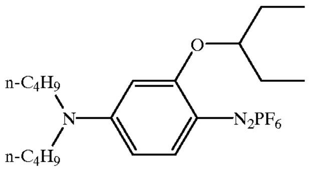

A-9

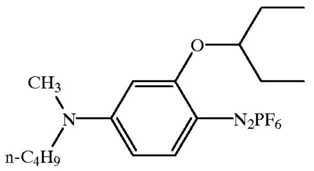

A-10

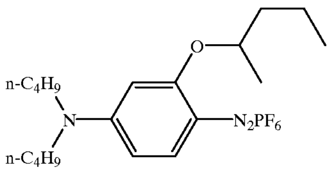

-continued

A-11

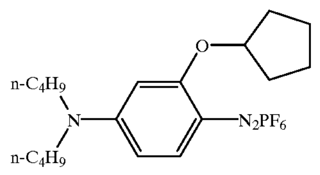

A-12

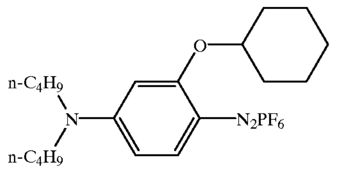

A-13

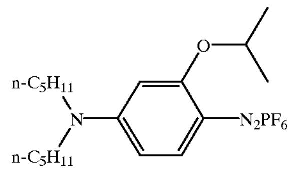

A-14

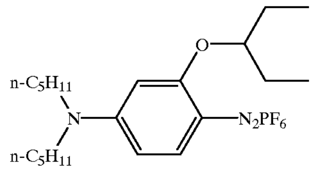

A-15

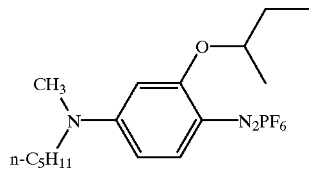

The diazo compound represented by the general formula (1) can be produced by a known method. Namely, it is obtained by diazotization of a corresponding aniline using sodium nitrite, nitrosyl sulfate, isoamyl nitrite and the like in an acidic solvent. A synthesis example of an exemplified compound A-11 is shown below.

[Synthesis Example of Exemplified Compound A-11]

(Synthesis of Raw Material 2-cyclopentyloxy-4-nitro-acetanilide)

A mixture of 49 g of 4-nitro-2-hydroxy-acetanilide, 41.5 g of potassium carbonate and 220 cc of dimethylacetamide was stirred at 70° C., to this was added dropwise 55.9 g of bromocyclopentane, the resulted mixture was heated to 90° C., and stirred for 6 hours. The reaction mixture was poured into 300 g of water to cause deposition of a crystal. This crystal was filtered, washed with water, and dried, to obtain 62.6 g of a loess-colored 2-cyclopentyloxy-4-nitro-acetanilide crystal.

(Synthesis of precursor 2-cyclopentyloxy-4-dibutylamino-acetanilide)

1.19 g of ammonium chloride, 60 cc of water, 180 cc of isopropanol and 58.14 g of an iron powder were heated under reflux, into which was added portion-wise 58.14 g of 2-cyclopentyloxy-4-nitro-acetanilide. The reaction mixture was stirred for 1 hour while heating, cooled to room temperature and then insoluble components were filtered through sellaite. A filtrate was concentrated to obtain 50.00 g of 4-amino-2-cyclopentyloxy-acetanilide. To the resulted 23.43 g of 4 -amino-2-cyclopentyloxy-acetanilide were added 34.6 g of potassium carbonate, 16.6 g of potassium iodide, and 170 cc of dimethylacetamide. Further, 41.1 g of 1-bromobutane was added, and the resulted mixture was stirred for 3 hours at 80° C. while heating. To the reaction mixture was added 350 cc of water, and the produced 2-cyclopentyloxy-4-dibutylamino-acetanilide was extracted with ethyl acetate. An organic layer was concentrated, and purified by column chromatography to obtain 30.55 g of 2-cyclopentyloxy-4-dibutylamino-acetanilide.

(Synthesis of Exemplified Compound A-11)

27.72 g of 2-cyclopentyloxy-4-dibutylamino-acetanilide was dissolved in 60 cc of methanol. To the resulted solution was added 44.2 cc of concentrated hydrochloric acid, and a mixture was stirred for 1 hour at 80° C. while heating. The reaction mixture was cooled to −10° C., and to this mixture was added dropwise 6.9 g of sodium nitrite dissolved in 15 cc of water. This was stirred for 1 hour at 10° C. Thereafter, 23.0 g of potassium hexafluorophosphate was added to the reaction mixture, and the resulted mixture was stirred for 1 hour at room temperature. The deposited crystal was filtered, washed sequentially with water and then isopropanol, and thereafter, the crystal was deposited again from ethanol. The resulted crystal was dried, and thereafter, 25.8 g of the exemplified compound A-11 was obtained. The ultraviolet visible absorption spectrum of the exemplified compound A-11 in methanol revealed $\lambda_{max}$ of 369 nm and $\epsilon$ of 36000.

The compounds represented by the general formula (1) may be any of an oil and crystal, and a crystal is preferable in view of ease of handling.

The compounds represented by the general formula (1) may be used alone or in combination of two or more.

When the compound represented by the general formula (1) is used in a photo-sensitive and heat-sensitive recording material, it is preferably used in an amount of from 0.02 to 5 g/m$^2$, and, in view of concentration of color generation, particularly preferably in an amount of from 0.1 to 4 g/m$^2$ in the photo-sensitive and heat-sensitive layer.

For stabilization of the above-described diazo compound, zinc chloride, cadmium chloride, tin chloride and the like can be used to form a complex compound for stabilization of the diazo compound. These diazo compounds may be used alone or in combination of two or more.

As a coupler that can be used in the present invention, any compound can be adopted providing it forms a dye by coupling with the diazo compound in a basic atmosphere and/or a neutral atmosphere. Any among so-called 4-equivalent couplers used as a silver halide photography photo-sensitive material can be used as the coupler, and can be selected according to intended hue.

For example, there are listed so-called active methylene compounds having a methylene group adjacent to a carbonyl group, phenol derivatives, naphthol derivatives and the like, and as specific examples, the following compounds are listed and used in a range in conformance with the object of the present invention.

A particularly preferable compound that can be used in the present invention is a compound represented by the following general formula (2).

$$E^1—CH_2—E^2 \quad \text{General formula (2)}$$

Next, a coupler represented by the general formula (2) will be described in detail. The electron-attractive groups represented by $E^1$, $E^2$ in the formula indicates a substituent having a positive Hammett $\sigma$ value, and they may be the same or different, the following being preferable: an acyl group, alkoxycarbonyl group, carbamoyl group, cyano group, nitro group, alkylsulfonyl group, arylsulfonyl group, heterocyclic group, phosphono group and the like. The following are also preferable: acyl groups such as an acetyl group, propionyl group, pivaloyl group, chloroacetyl group, trichloroacetyl group, trifluoroacetyl group, 1-methylcyclopropylcarbonyl group, 1- ethylcyclopropylcarbonyl group, 1-benzylcyclopropylcarbonyl group, benzoyl group, 4-methoxybenzoyl group, thenoyl group and the like; oxycarbonyl groups such as a methoxycarbonyl group, ethoxycarbonyl group, 2-methoxyethoxycarbonyl group, 4-methoxyphenoxycarbonyl group and the like; carbamoyl groups such as a carbamoyl group, N,N-dimethylcarbamoyl group, N,N-diethylcarbamoyl group, N-phenylcarbamoyl group, N-[2,4-bis(pentyloxy)phenyl]carbamoyl group, N-[2, 4-bis(octyloxy)phenyl]carbamoyl group, morpholinocarbamoyl group and the like; alkylsulfonyl groups or arylsulfonyl groups such as a methanesulfonyl group, benzenesulfonyl group, toluenesulfonyl group and the like; phosphono groups such as a diethylphosphono group and the like; heterocyclic groups such as a benzooxazole-2-yl group, benzothiazole-2-yl group, 3,4-dihydroquinazoline-4-one-2-yl group, 3,4-dihydroquinazoline-4-sulfone-2-yl group and the like; a nitro group; an imino group; and a cyano group.

The electron-attractive groups represented by $E^1$, $E^2$ may be bonded to form a ring. As the ring formed of $E^1$ and $E^2$, a 5 to 6-membered carbon ring or hetero ring is preferable.

Specific examples thereof include resorcin, phloroglucine, 2,3-dihydroxynaphthalene, sodium 2,3-dihydroxynaphthalene-6-sulfonate, N-3-morpholinopropyl-1-hydroxy-2-naphthalenesulfonamide, sodium 2-hydroxy-3-naphthalenesolfonate, 2-hydroxy-3-naphthalenesulfonanilide, N-3-morpholinopropyl-2-hydroxy-3-naphthalenesulfonamide, N-3-(2-ethylhexyl) propyl-2-hydroxy-3-naphthalenesulfonamide, N-2-ethylhexyl-2-hydroxy-3-naphthalenesulfonamide, 5-acetamido-1-naphthol, sodium 1-hydroxy-8-acetamidonaphthalene-3,6-disulfonate, 1-hydroxy-8-acetamidonaphthalene-3,6-dissulfonanilide, 1,5-dihydroxynaphthalene, N-3-morpholinopropyl-2-hydroxy-3-naphthamide, N- octyl-2-hydroxy-3-naphthamide, 2-hydroxy-3-naphthanilide, 5,5-dimethyl-1,3-cyclohexanedione, 1,3-cyclopentanadione, 5-(2-n-tetradecyloxyphenyl)-1,3-cyclohexanedione, 5-phenyl-4-methoxycarbonyl-1,3-cyclohexanedione, 5-(2,5-di-n-octyloxyphenyl)-1,3-cyclohexanedione, N,N'-dicyclohexylbarbituric acid, N,N'-di-n-dodecylbarbituric acid, N-n-octyl-N'-n-octadecylbarbituric acid, N-phenyl-N'-(2,5-di-n-octyloxyphenyl)barbituric acid, N,N'-bis (octadecyloxycarbonylmethyl)barbituric acid, 1-phenyl-3-methyl-5-pyrazolone, 1-(2,4,6-trichlorophenyl)-3-anilino-5-pyrazolone, 1-(2,4,6-trichlorophenyl)-3-benzamide-5-pyrazolone, 6-hydroxy-4-methyl-3-cyano-1-(2-ethylhexyl)-2-pyridone, 2,4-bis-(benzoylacetamide)toluene, 1,3-bis-(pivaloylacetamidemethyl)benzene, benzoylacetnitrile, thenoylacetnitrile, acetacetanilide, benzoylacetanilide, pivaloylacetanilide, 2-chloro-5-(N-n-butylsulfamoyl)-1-pivaloylacetamidebenzene, 1-(2-ethylhexyloxypropyl)-3-cyano-4-methyl-6-hydroxy-1,2-dihydropyridine-2-one, 1-(dodecyloxypropyl)-3-acetyl-4-methyl-6-hydroxy-1,2-dihydropyridine-2-one, 1-(4-n-octyloxyphenyl)-3-tert-butyl-5-aminopyrazole and the like. The details of the coupler are described in Japanese Patent Application Laid-Open (JP-A) Nos. 4-201483, 7-223367, 7-223368, 7-323660, Japanese Patent Application Nos. 5-278608, 5-297024, 6-18669, 6-18670, 7-316280, 8-027095, 8-027096, 8-030799, 8-12610, 8-132394, 8-358755, 8-358756, 9-069990 and the like.

Specific examples of the coupler represented by the general formula (2) of the present invention include, but are not limited to, the following compounds.

B-1

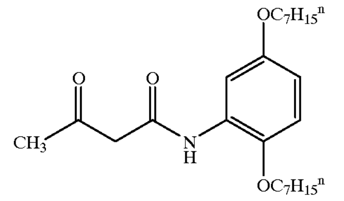

B-2

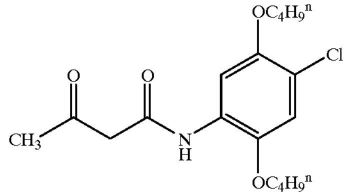

B-3

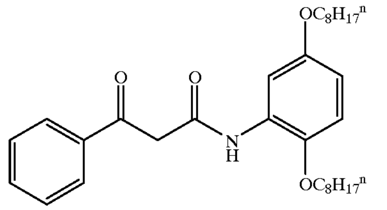

B-4

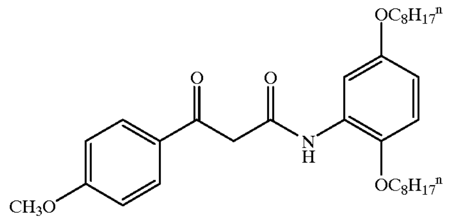

B-5

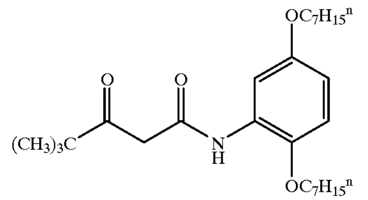

B-6

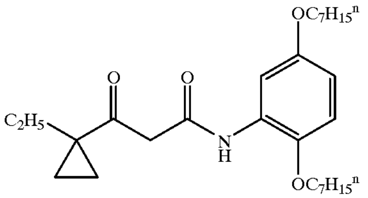

B-7

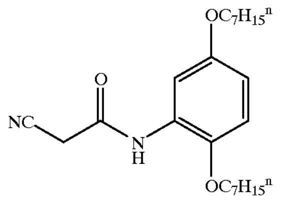

-continued
B-8
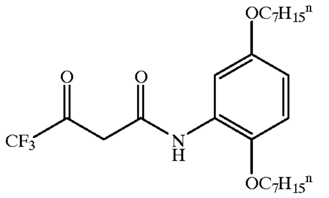
B-9
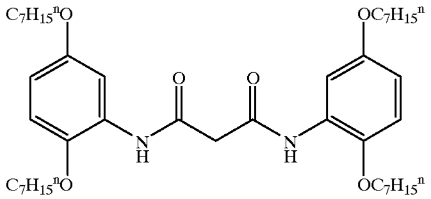
B-10
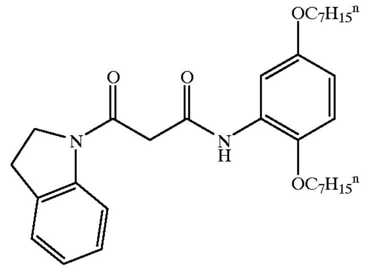
B-11
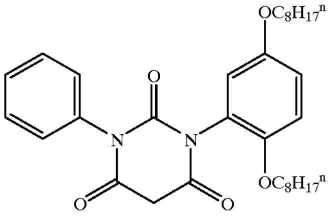
B-12
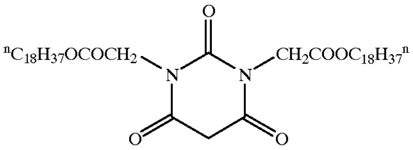
B-13
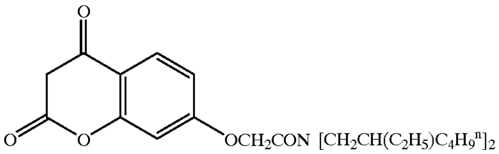
B-14
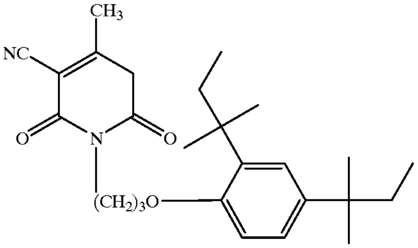
-continued
B-15
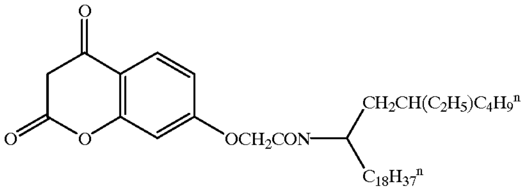
B-16
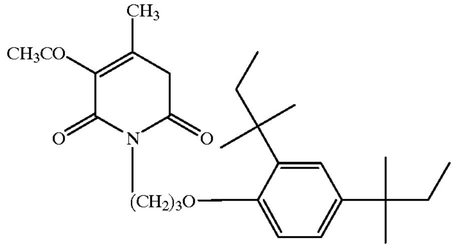
B-17
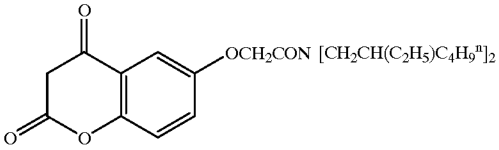
B-18
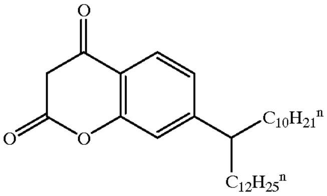
B-19
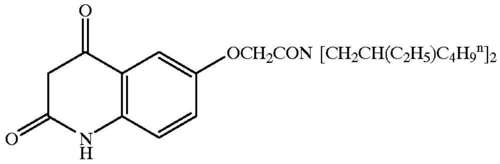
B-20
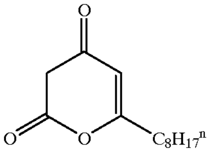
B-21
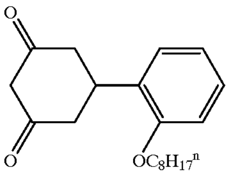

-continued

B-22

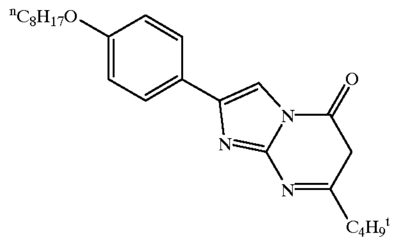

B-23

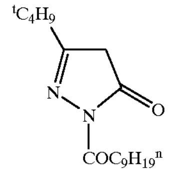

B-24

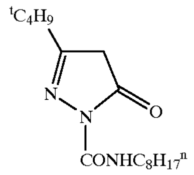

B-25

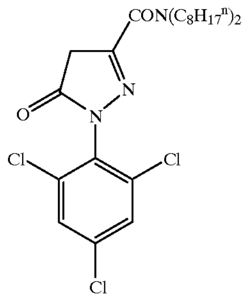

B-26

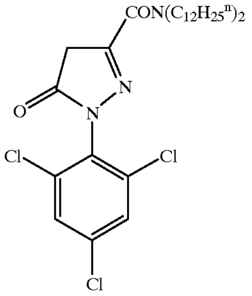

B-27

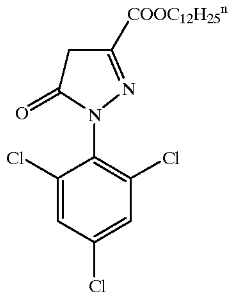

-continued

B-28

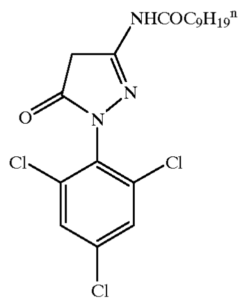

B-29

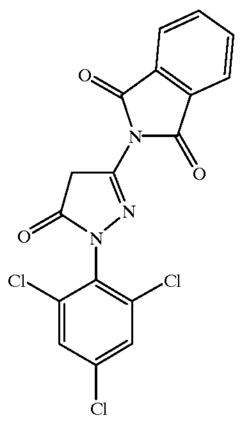

B-30

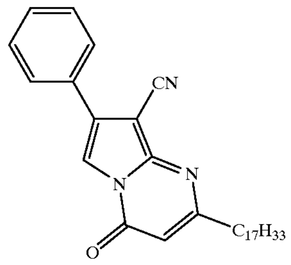

In a photo-sensitive and heat-sensitive recording material of the present invention, the diazo compound is enclosed in a microcapsule to obtain excellent virgin stock storability before use. Already known methods can be used for forming the microcapsule containing the diazo compound. A polymer material forming a capsule wall is required to be impermeable at ordinary temperatures and permeable during heating, and that having a glass transition temperature of from 60 to 200° C. is particularly preferable. As examples thereof, there can be listed a polyurethane, polyurea, polyamide, polyester, urea-formaldehyde resin, melamine resin, polystyrene, styrene-methacrylate copolymer, styrene-acrylate copolymer and mixture thereof.

As a method for forming the microcapsule, an interfacial polymerization method and internal polymerization method are suitable. Details of capsule forming methods and specific examples of reactants are described in U.S. Pat. Nos. 3,726,804, 3,796,669 and the like. For example, when a polyurea and polyurethane are used as the capsule wall material, a polyisocyanate and a second substance that reacts with the polyisocyanate to form the capsule wall (for example, a polyol, polyamine) are mixed into an aqueous medium or an oily medium to be made into the capsule wall, these are emulsified and dispersed in water, and thereafter, heated to cause polymer formation reaction at the interface of an oil drop to form a microcapsule wall. Even if addition of the above-described second substance is omitted, a polyurea is formed.

In the present invention, the polymer substance forming the microcapsule wall is preferably at least one selected from polyurethanes and polyureas.

A method for producing a diazo compound-enclosing microcapsule (polyurea-polyurethane wall) in the present invention will be described below.

First, the diazo compound is dissolved or dispersed into a hydrophobic organic solvent which will form a core of the capsule. In this case, the organic solvent preferably has a boiling point of 100 to 300° C. Further, a polyvalent isocyanate is added as a wall material into a core solvent (oil phase).

On the other hand, as an aqueous phase, an aqueous solution into which water-soluble polymers such as polyvinyl alcohol, gelatin and the like are dissolved is prepared, then, the above-described oil phase is added, and emulsification for dispersion is conducted by means such as a homogenizer and the like. In this operation, the water-soluble polymer acts as a stabilizer for the emulsification for dispersion. For conducting the emulsification for dispersion in a more stable manner, a surfactant may be added to at least one of the oil phase and the aqueous phase.

The amount used of the polyvalent isocyanate is determined so that the average particle size of the microcapsule is from 0.3 to 12 μm and the wall thickness is from 0.01 to 0.3 μm. The particle size of the dispersed particle is generally from about 0.2 to 10 μm. In the emulsified and dispersed solution, a polymerization reaction of the poyvalent isocyanate occurs at an interface between the oil phase and the aqueous phase to form a polyurea wall.

If a polyol is previously added into the aqueous phase, the polyvalent isocyanate and the polyol can react to form a polyurethane wall. For accelerating the reaction speed, it is preferable that the reaction temperature is kept high or that a suitable polymerization catalyst is added. The polyvalent isocyanate, polyol, reaction catalyst, or polyamines for forming a part of the wall material are described in detail in published documents (Keiji Iwata, Polyurethane Handbook edited by Nikkan Kogyo Shinbun Publication (1987)).

As the polyvalent isocyanate compound used as a raw material of the microcapsule wall, a compound having a 3- or more-functional isocyanate groups is preferable. A 2-functional isocyanate compound may be simultaneously used. Specifically, there are listed dimers or trimers (buret or isocyanurate) of diisocyanate main raw materials such as xylylene diisocyanate and hydrogenated materials thereof, hexamethylene diisocyanate, tolylene diisocyanate and hydrogenated materials thereof, isophorone diisocyanate and the like, polyfunctional adducts of polyols such as trimethylolpropane and the like with 2-functional isocyanates such as xylylene diisocyanate and the like, compounds obtained by introduction of polymer compounds such as a polyether and the like having an active hydrogen such as polyethylene oxide into adducts of polyols such as trimethylolpropane with 2-functional isocyanates such as xylylene diisocyanate and the like, formalin condensation product of benzene isocyanate, and the like.

Compounds described in JP-A Nos. 62- 212190, 4-26189, 5-317694, Japanese Patent Application No. 8-268721, and the like are preferable.

Further, a polyol or polyamine can be added beforehand to the hydrophobic solvent which will form the core or to the water-soluble polymer solution which will be the dispersing medium, and used as a raw material for the microcapsule wall. As specific examples of the polyol or polyamine, propylene glycol, glycerine, trimethylolpropane, triethanolamine, sorbitol, hexamethylenediamine and the like are listed. When the polyol is added, a polyurethane wall is formed.

As the hydrophobic organic solvent used when the above-described diazo compound is dissolved and the core of the microcapsule is formed, an organic solvent having a boiling point of 100 to 300° C. is preferable, and as specific examples thereof, there are listed an alkylnaphthalene, alkyldiphenylethane, alkyldiphenylmethane, alkylbiphenyl, alkylterphenyl, chlorinated paraffin, phosphates, maleates, adipates, phthalates, benzoates, carbonates, ethers, sulfates, sulfonates and the like. These may be used in admixture of two or more.

When solubility of the diazo compound forming the capsule in such a solvent is poor, a solvent having a lower boiling point manifesting high dissolvability of the diazo compound to be used can also be used as an auxiliary means. Specifically, there are listed as examples ethyl acetate, butyl acetate, methylene chloride, tetrahydrofuran, acetonitrile, acetone and the like. Therefore, it is preferable that the diazo compound has appropriate solubilities with respect to these hydrophobic organic solvents having higher boiling points and auxiliary solvents having lower boiling points. Specifically, it is preferable that the diazo compound has a solubility of 5% or greater with respect to the solvent. A solubility of 1% or less in water is preferable.

The water-soluble polymer used in a water-soluble polymer aqueous solution dispersing the oil phase of the capsule thus prepared is preferably a water-soluble polymer having a solubility in water of 5% or greater at temperatures for emulsification, and as specific examples thereof, there are listed polyvinyl alcohol and denatured materials thereof, polyacrylic amide and derivatives thereof, ethylene-vinyl acetate copolymer, styrene-maleic anhydride copolymer, ethylene-maleic anhydride copolymer, isobutylene-maleic anhydride copolymer, polyvinylpyrrolidone, ethylene-acrylic acid copolymer, vinyl acetate-acrylic acid copolymer, carboxymethylcellulose, methylcellulose, casein, gelatin, starch derivatives, gum arabic, sodium alginate and the like.

It is preferable that the water-soluble polymer has no reactivity or a lower reactivity with an isocyanate compound. For example, a polymer having a reactive amino group in the molecular chain such as gelatin must be previously modified and the like to reduce the reactivity.

Further, when the surfactant is added, it is preferable that the amount added of the surfactant is of from 0.1 to 5%, particularly of from 0.5 to 2%, based on the weight of the oil phase.

Emulsification can be conducted using known emulsification apparatuses such as a homogenizer, Mantongory, supersonic disperser, dissolver, Keddy mill and the like. After emulsification, an emulsion is heated at 30 to 70° C. to promote a capsule wall forming reaction. In the reaction, it is necessary that water is added to decrease probability of mutual collision of capsules, sufficient stirring is conducted, and the like, to prevent agglomeration between the capsules.

Further, during the reaction, a dispersant for preventing agglomeration may be added again. With progress of the polymerization reaction, generation of a carbon dioxide gas is observed, and completion thereof can be regarded approximately as completion of the capsule wall forming reaction. Usually, the intended diazo compound-enclosing microcapsule can be obtained by a reaction over several hours.

The coupler used in the present invention can be dispersed in solid form with a water-soluble polymer by a sand mill and the like and used together with a basic material, another color developing aid and the like. However, it is preferable that the coupler is dissolved in an organic solvent that is poorly soluble or insoluble in water, and that thereafter, the result is mixed with the aqueous phase having the surfactant and/or water-soluble polymer as a protective colloid, to form the emulsified dispersion. The surfactant is preferably used, in view of ease of emulsification and dispersion.

The organic solvent used in this case can be selected, for example, from oils having higher boiling points described in JP-A No. 2-141279.

Among these, it is preferable to select esters in view of emulsification stability of the emulsified dispersion. Among these, tricresyl phosphate is particularly preferable.

The above-described oils can also be used in mutual combination or in combination with other oils.

An auxiliary solvent can also be added, as a solution aid having a lower boiling point, to the above-described organic solvent. As such an auxiliary solvent, for example, ethyl acetate, ispropyl acetate, butyl acetate, methylene chloride and the like can be listed as preferable examples. Depending on occasion, it is also possible that only the auxiliary solvent having a lower boiling point is used, without using the oil having a higher boiling point.

The water-soluble polymer to be contained as a protective colloid into the aqueous phase to be mixed with the oil phase containing these components can be appropriately selected from known anionic polymers, nonionic polymers and ampholytic polymers. Preferable examples of the water-soluble polymer include polyvinyl alcohol, gelatin, cellulose derivatives and the like.

As the surfactant to be contained in the aqueous phase, that which does not cause precipitation and agglomeration by reaction with the above-described protective colloid can be appropriately selected for use from anionic or nonionic surfactants. Preferable examples of the surfactant include sodium alkylbenzenesulfonate, sodium alkylsulfate, sodium salt of dioctyl sulfosuccinate, polyalkylene glycol (for example, polyoxyethylene nonylphenyl ether), and the like.

In the present invention, an organic base can also be added for the purpose of promoting a coupling reaction of the diazo compound with the coupler. These organic bases can be used alone or in combination of two or more. As the basic substance, nitrogen-containing compounds are listed as examples, such as tertiary amines, piperidines, piperazines, amidines, formamidines, pyridines, guanidines, morpholines and the like. Those described in Japanese Patent Application Publication (JP-B) No. 52-46806, JP-A Nos. 62-70082, 57-169745, 60-94381, 57-123086, 58-1347901, 60-49991, JP-B Nos. 2-24916, 2-28479, JP-A Nos. 60-165288, 57-185430, and the like can be used.

Among these, piperazines such as N,N'-bis(3-phenoxy-2-hydroxypropyl)piperazine, N,N'-bis[3-(p-methylphenoxy)-2-hydroxypropyl]piperazine, N,N'-bis[3-(p-methoxyphenoxy)-2-hydroxypropyl]piperazine, N,N'-bis(3-phenylthio-2-hydroxypropyl)piperazine, N,N'-bis[3-(β-naphthoxy)-2-hydroxypropyl]piperazine, N-3-(β-naphthoxy)-2-hydroxypropyl-N'-methylpiperazine, 1,4-bis{[3-(N-methylpiperazino)-2-hydroxy]propyloxy}benzene and the like, morpholines such as N-[3-(β-naphtoxy)-2-hydroxy]propylmorpholine, 1,4-bis(3-morpholino-2-hydroxypropyloxy)benzene, 1,3-bis(3-morpholino-2-hydroxypropyloxy)benzene and the like, piperidines such as N-(3-phenoxy-2-hydroxypropyl)piperidine, N-dodecylpiperidine and the like, guanidines such as triphenylguanidine, tricyclohexylguanidine, dicyclohexylphenylguanidine and the like are particularly preferable.

In the present invention, the amounts used of the coupler and a basic substance based on 1 part by weight of the diazo compound are each from 0.1 to 30 parts by weight.

In the present invention, in addition to the above-described organic base, a color developing aid can be added for the purpose of promoting a color developing reaction. The color developing aid is a substance that increases concentration of color generation in heat recording or decreases the minimum color developing temperature, and is used for creating conditions in which the diazo compound, basic substance, coupler and the like easily react by reducing the respective melting points of the coupler, basic substance, diazo compound or the like or reducing the softening point of the capsule wall.

As the color developing aid used in the present invention, phenol derivatives, naphthol derivatives, alkoxy-substituted benzenes, alkoxy-substituted naphthalenes, aromatic ether, thioether, ester, amide, ureide, urethane, sulfonamide compounds, hydroxy compounds and the like can be added into a color forming layer so that heat printing can be conducted quickly and completely at lower energy, for example.

In the photo-sensitive and heat-sensitive recording material of the present invention, known antioxidants and the like described below are preferably used for the purpose of increasing fastness of heat color developed image under light and heat, or reducing yellowing of un-printed parts after fixation by the action of a light.

The above-mentioned antioxidants are described for example in EP-A Nos. 223739, 309401, 309402, 310551, 310552, 459416, DE-A No. 3435443, JP-A Nos. 54-48535, 62-262047, 63-113536, 63-163351, 2-262654, 2-71262, 3-121449, 5-61166, 5-119449, U.S. Pat. Nos. 4,814,262, 4,980,275 and the like.

Further, in the present invention, known various additives already used in heat-sensitive recording materials and pressure-sensitive recording materials can also be effectively used. As specific examples of these various additives, there can be listed compounds described in JP-A Nos. 60-107384, 60-107383, 60-125470, 60-125471, 60-125472, 60-287485, 60-287486, 60-287487, 60-287488, 61-160287, 61-185483, 61-211079, 62-146678, 62-146680, 62-146679, 62-282885, 63-051174, 63-89877, 63-88380, 63-088381, 63-203372, 63-224989, 63-251282, 63-267594, 63-182484, 1-239282, 4-291685, 4-291684, 5-188687, 5-188686, 5-110490, 5-1108437, 5-170361, JP-B Nos. 48-043294, 48-033212 and the like.

Specific examples thereof include 6-ethoxy-1-phenyl-2,2,4-trimethyl-1,2-dihydroquinoline, 6-ethoxy-1-octyl-2,2,4-trimethyl-1,2-dihydroquinoline, 6-ethoxy-1-phenyl-2,2,4-trimethyl-1,2,3,4-tetrahydroquinoline, 6-ethoxy-1-octyl-2,2,4-trimethyl-1,2,3,4-tetrahydroquinoline, nickel cyclohexanecarboxylate, 2,2-bis(4-hydroxyphenyl)propane, 1,1-bis(4-hydroxyphenyl)-2-ethylhexane, 2-methyl-4-methoxydiphenylamine, 1-methyl-2-phenylindol and the like.

The amounts added of these antioxidants and various additives are preferably from 0.05 to 100 parts by weight, particularly preferably from 0.2 to 30 parts by weight based on 1 part by weight of a diazo compound.

These known antioxidants and various additives can be contained in the microcapsule together with the diazo compound for use, or can be used as a solid dispersion or as an emulsion with a suitable emulsifying aid together with the coupler, basic substance, and other color developing aids, or can be used in both forms. Needless to say, the antioxidants and various additives can be used alone or in combination of two or more. Alternatively, they can be added or allowed to exist in a protective layer.

These antioxidants and various additives are not required to be added to the same layer. Further, when a plurality of these antioxidants and various additives are combined for use, they may be subjected to structural classification, for example as anilines, alkoxybenzenes, hindered phenols, hindered amines, hydroquinone derivatives, phosphorus compounds and sulfur compounds. Compounds having different structures from each other may be combined or a plurality of compounds having the same structure can also be combined.

Into the photo-sensitive and heat-sensitive recording material of the present invention, a free radical generating agent (compound generating free radicals with irradiation) which is used in a light-polymerizable composition and the like can be added for the purpose of reducing yellowing of base portions after recording. As the free radical generating agent, there are listed as examples aromatic ketones, quinones, benzoin, benzoin ethers, azo compounds, organic disulfides, acyloxime esters, and the like. The amount added of the free radical generating agent is of from 0.01 to 5 parts by weight per 1 part by weight of the diazo compound.

Likewise, a polymerizable compound having a ethylenically unsaturated bond (hereinafter, referred to as a vinyl monomer) can be used for the purpose of reducing yellowing. The vinyl monomer is a compound having in a chemical structure thereof at least one ethylenically unsaturated bond (vinyl group, vinylidene group and the like) and having a chemical form of a monomer or prepolymer. As examples thereof the following may be listed: unsaturated carboxylic acids and salts thereof, esters of unsaturated carboxylic acids with aliphatic polyhydric alcohols, amides of unsaturated carboxylic acids with aliphatic polyvalent amines, and the like. The vinyl monomer is used in a proportion of 0.2 to 20 parts by weight per 1 part by weight of a diazo compound.

The above-described free radical generating agent and vinyl monomer can also be contained in the microcapsule together with the diazo compound, and thus used.

In the present invention, citric acid, tartaric acid, oxalic acid, boric acid, phosphoric acid, pyrophosphoric acid and the like can be added as an acid stabilizer in addition to the above-described materials.

To obtain the photo-sensitive and heat-sensitive recording material of the present invention, it is preferable that a coating solution comprising the microcapsule containing the diazo compound; the coupler and organic base, and other additives is prepared, applied onto a substrate such as paper, synthetic resin film or the like by a coating method such as bar coating, blade coating, air knife coating, gravure coating, roll coating, spray coating, dip coating, curtain coating and the like and dried to form a heat-sensitive layer having a solid content of 2.5 to 30 g/m$^2$.

In the photo-sensitive and heat-sensitive recording material of the present invention, the microcapsule, coupling component, base and the like may be contained in the same layer. A laminate structure in which they are contained in different layers can also be adopted. Further, it is also possible that an intermediate layer such as that described in Japanese Patent Application No. 59-177669 and the like is provided on a substrate, then, a heat-sensitive layer is applied on the layer.

As a binder used in the photo-sensitive and heat-sensitive recording material of the present invention, known water-soluble polymer compounds, latexes and the like can be used. As the water-soluble polymer compounds, there are listed as examples methylcellulose, carboxymethylcellulose, hydroxyethylcellulose, hydroxypropylcellulose, starch derivative, casein, gum arabic, gelatin, ethylene-maleic anhydride copolymer, styrene-maleic anhydride copolymer, polyvinylalcohol, epichlorohydrin-modified polyamide, isobutylene-anhydrous maleic salicylic acid copolymer, polyacrylic acid, polyacrilic amide and the like and modified compounds thereof. As the latexes, there are listed as examples styrene-butadiene rubber latex, methyl acrylate-butadiene rubber latex, vinyl acetate emulsion and the like.

As a pigment that can be used in the photo-sensitive and heat-sensitive recording material of the present invention, known pigments can be used irrespective of whether they are organic or inorganic. Specific examples thereof include kaolin, sintered kaolin, talc, agalmatolite, diatomaceous earth, calcium carbonate, aluminum hydroxide, magnesium hydroxide, zinc oxide, lithopone, amorphous silica, colloidal silica, sintered gypsum, silica, magnesium carbonate, titanium oxide, alumina, barium carbonate, barium sulfate, mica, micro balloon, urea-formalin filler, polyester particles, cellulose filler and the like.

In the photo-sensitive and heat-sensitive recording material of the present invention, various additives such as a known wax, antistatic agent, defoaming agent, electron conductive agent, fluorescent dye, surfactant, ultraviolet ray absorber and precursors thereof and the like can be used as necessary.

In the photo-sensitive and heat-sensitive recording material of the present invention, the protective layer may also be provided on the surface of a recording layer, if necessary. The protective layer may also be laminated to form two or more layers, according to need. As material used for the protective layer, water-soluble polymer compounds such as polyvinyl alcohol, carboxy-modified polyvinyl alcohol, vinyl acetate-acrylamide copolymer, silicon-modified polyvinyl alcohol, starch, modified starch, methylcellulose, carboxymethylcellulose, hydroxymethylcellulose, gelatins, gum arabic, casein, styrene-maleic acid copolymer hydrolyzate, styrene-maleic acid copolymer half ester hydrolyzate, isobutylene-maleic anhydride copolymer hydrolyzate, polyacrylamide derivative, polyvinylpyrrolidone, sodium polystyrenesulfonate, sodium alginate and the like, and latexes such as styrene-butadiene rubber latex, acrylonitrile-butadiene rubber latex, methyl acrylate-butadiene rubber latex, vinyl acetate emulsion and the like are used. Storage stability can also be further improved by crosslinking a water-soluble polymer compound in the protective layer. As the crosslinking agent, known crosslinking agents can be used. Specifically, there are listed as examples water-soluble initial condensation products such as N-methylolurea, N-methylolmelamine, urea-formali and the like, dialdehyde compounds such as glyoxal, glutaraldehyde and the like, inorganic crosslinking agents such as boric acid, borax and the like, polyamide epichlorohydrin and the like. Further, in the protective layer, known pigments, metal soap, wax, surfactants and the like can also be used. The amount applied of the protective layer is preferably of from 0.2 to 5 g/m$^2$, and further preferably of from 0.5 to 2 g/m$^2$. The film thickness thereof is preferably of from 0.2 to 5 $\mu$m, and particularly preferably of from 0.5 to 2 $\mu$m.

When the protective layer is used in the photo-sensitive and heat-sensitive recording material of the present invention, the protective layer may contain a known ultraviolet ray absorber or a precursor thereof.

As the substrate in the present invention, any of paper substrates used for ordinary pressure-sensitive paper and heat-sensitive paper, dry or wet diazo copying paper and the like can be used. Acidic paper, neutral paper, coated paper, plastic film laminated paper, synthetic paper, plastic film and the like can also be used.

A back coat layer may be provide for the purpose of correcting curl balance of the substrate or improving chemical resistance from the rear surface. Releasing paper may be combined with the rear surface via an adhesive layer to make a label form. This back coat can be also provided in the same manner as the protective layer.

When a recording surface of the photo-sensitive and heat-sensitive recording material of the present invention is heated by a thermal head or the like, the capsule wall made of a polyurea and/or polyurethane is softened, and the coupler and basic compound outside the capsule permeate into the capsule and color develops. After color development, fixation of the image is conducted since the diazo compound is decomposed and loses its reactivity with the coupler, via irradiation with a light having an absorption wavelength of the diazo compound.

As the fixation light source, various fluorescent lamps, xenon lamps, mercury lamps or the like are used. It is preferable that the emission spectrum approximately corresponds to the absorption spectrum of the diazo compound used in the photo-sensitive and heat-sensitive recording material since efficient fixation is then possible.

In the present invention, a fixation light source having an emission central wavelength of 360 to 380 nm is particularly preferable.

In the present invention, light-decomposable diazo compounds having different light-decomposition wavelengths can be used in the different layers to form a multi-color recording material.

When the photo-sensitive and heat-sensitive recording material of the present invention is made as the multi-color recording material, an intermediate layer can also be provided for preventing mutual color mixing of the photo-sensitive and heat-sensitive recording layers. This intermediate layer is composed of a water-soluble polymer compound such as gelatin, phthalated gelatin, polyvinyl alcohol, polyvinyl pyrrolidone and the like, and may contain various additives as is appropriate.

EXAMPLES

The following examples illustrate further the present invention but do not limit the scope thereof.

Example 1

(Preparation of Diazonium Salt-Containing Microcapsule Liquid A)

To 16.0 parts of ethyl acetate were added 2.4 parts of a diazo compound (A-5) and 12.1 parts of tricresyl phosphate and the result was mixed uniformly. Then, to this mixture solution was added 8.8 parts of Takenate D110N (manufactured by Takeda Chemical Industries Ltd.) as a wall material and the mixture was mixed to obtain an I liquid. Next, this I liquid was added to a mixture of 60 parts of an 8% aqueous solution of phthalate gelatin and 23.5 parts of water, and the result was emulsified and dispersed for 10 minutes at 40° C. and 9000 rpm using a homogenizer. To the resulted emulsion was added 20 parts of water, and the mixture was made uniform. Thereafter, a capsule forming reaction was allowed to occur for 3 hours at 40° C. while stirring to obtain a capsule liquid A. The particle size of the capsule was from 0.9 to 1.1 μm.

(Preparation of Coupler Emulsion B)

Into 10.5 parts of ethyl acetate were dissolved 3 parts of a coupler (B-30), 3 parts of triphenylguanidine, 0.5 parts of tricresyl phosphate, and 0.24 parts of diethyl maleate, to obtain a II liquid.

Next, 49 parts of a 15% aqueous solution of lime-treated gelatin, 9.5 parts of a 10% aqueous solution of sodium dodecylbenzenesulfonate and 35 parts of water were mixed uniformly at 40° C. and to this mixture was added the II liquid. The result was emulsified and dispersed for 10 minutes at 40° C. and 10000 rpm using a homogenizer. The resulted emulsion was stirred for 2 hours at 40° C. to remove ethyl acetate, and thereafter, the amount of ethyl acetate and water that evaporated was compensated for by adding water, to obtain a capsule liquid B.

(Preparation of Photo-Sensitive and Heat-Sensitive Recording Layer Coating Liquid C)

3.0 parts of the capsule liquid A, 3.0 parts of water and 5.8 parts of the coupler emulsion B were mixed to obtain a photo-sensitive and heat-sensitive recording layer coating liquid C.

(Preparation of Protective Layer Coating Liquid D)

100 parts of a 6% aqueous solution of itaconic acid-modified polyvinyl alcohol (KL-318; trade name, manufactured by Kuraray Co., Ltd.) and 10 parts of a 30% dispersion of epoxy-modified polyamide (FL-71; trade name, manufactured by Toho Kagaku K. K.) were mixed, and into this mixture was uniformly mixed 15 parts of a 40% dispersion of zinc stearate (Hydrin Z; trade name, manufactured by Chukyo Yushi K. K.), to obtain a protective layer coating liquid D.

(Application)

The heat-sensitive recording layer coating liquid C and the protective layer coating liquid D were applied in that order by a wire bar onto a substrate for a developing paper made by laminating a polyethylene on high quality paper, and the result was dried at 50° C. to obtain an intended heat-sensitive recording material. The amounts applied in terms of solid components were 8.0 g/$m^2$ and 1.2 g/$m^2$ respectively.

(Color Developing Test)

Heat developing was conducted on a heat-sensitive recording material using a thermal head (KST type) manufactured by Kyocera Corp., determining voltage applied to the thermal head and pulse width so that the recording energy per unit area was 50 mj/$mm^2$, and an image was obtained. Next, the material was exposed under an ultraviolet ray lamp having an emission central wavelength of 365 nm and an output of 40 W and the concentration of the base portions was measured.

(Test for Virgin Stock Storability)

The heat-sensitive recording material before recording was forcibly stored for 72 hours under conditions of 60° C. and 30% RH. After the forced storage, the material was exposed under an ultraviolet ray lamp having an emission central wavelength of 365 nm and an output of 40 W and the concentration of the base portions was measured.

(Concentration Measurement)

The concentration of color developed portions was measured at a C or M position and the concentration of the base portions was measured at a Y position using a Macbeth densitometer "Macbeth RD 918".

Example 2

A photo-sensitive and heat-sensitive recording material was made and evaluated in the same manner as in Example 1 except that 3.0 parts of B-13 was used as the coupler.

Example 3

A photo-sensitive and heat-sensitive recording material was made and evaluated in the same manner as in Example 1 except that 2.4 parts of A-7 was used as the diazo compound.

Example 4

A photo-sensitive and heat-sensitive recording material was made and evaluated in the same manner as in Example 1 except that 2.6 parts of A-8 was used as the diazo compound.

Example 5

A photo-sensitive and heat-sensitive recording material was made and evaluated in the same manner as in Example 1 except that 2.6 parts of A-10 was used as the diazo compound.

Example 6

A photo-sensitive and heat-sensitive recording material was made and evaluated in the same manner as in Example 1 except that 2.6 parts of A-11 was used as the diazo compound.

Example 7

A photo-sensitive and heat-sensitive recording material was made and evaluated in the same manner as in Example 1 except that 2.7 parts of A-12 was used as the diazo compound.

Example 8

A photo-sensitive and heat-sensitive recording material was made and evaluated in the same manner as in Example 1 except that 2.6 parts of A-13 was used as the diazo compound.

Comparative Example 1

A photo-sensitive and heat-sensitive recording material was made and evaluated in the same manner as in Example 1 except that 3.0 parts of C-1, which is described below, was used as the diazo compound.

Comparative Example 2

A photo-sensitive and heat-sensitive recording material was made and evaluated in the same manner as in Example 1 except that 3.6 parts of C-2, which is described below, was used as the diazo compound.

C-1

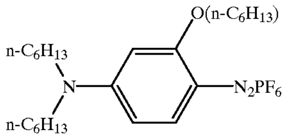

C-2

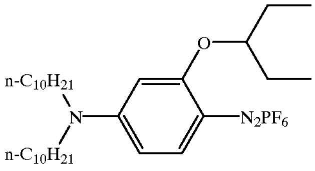

The results are shown below.

TABLE 1

| | Color developing test | | Test of virgin stock |
|---|---|---|---|
| | Color-developed concentration | Base concentration | storability Base concentration |
| Example 1 | 1.64 | 0.10 | 0.14 |
| Example 2 | 1.58 | 0.11 | 0.15 |
| Example 3 | 1.65 | 0.10 | 0.13 |
| Example 4 | 1.61 | 0.09 | 0.13 |
| Example 5 | 1.62 | 0.11 | 0.14 |
| Example 6 | 1.61 | 0.10 | 0.13 |
| Example 7 | 1.58 | 0.09 | 0.14 |
| Example 8 | 1.60 | 0.11 | 0.14 |
| Comparative example 1 | 1.60 | 0.14 | 0.24 |
| Comparative example 2 | 1.58 | 0.16 | 0.25 |

It is understood from Table 1 that even if the photo-sensitive and heat-sensitive recording material of the present invention is used while maintaining the concentration of color developed portions at a high level, coloring of the base portions is low not only directly after production but also after forced storage under high temperature and high humidity. In particular, when compared with a diazonium compound having a linear alkoxy group at an ortho position of a diazonio group (Comparative Example 1) and a diazo compound having a long chain dialkylamino group at a para position (Comparative Example 2), it is known that the photo-sensitive and heat-sensitive recording material of the present invention reveals less coloring of the base portions even when used after the forced storage, and that the virgin stock storability is further improved.

What is claimed is:

1. A photo-sensitive and heat-sensitive recording material comprising a substrate supporting thereon a photo-sensitive and heat-sensitive recording layer containing a diazo compound and a coupler, wherein said diazo compound represented by the following general formula (1) and said diazo compound is enclosed in a microcapsule:

General formula (1)

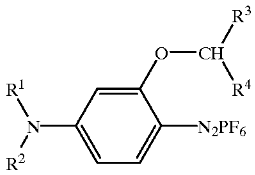

wherein $R^1$ and $R^2$ may be the same or different, and represent an unsubstituted alkyl group having 1 to 5 carbon atoms; $R^1$ and $R^2$ may be bonded to each other to form a ring; $R^3$ and $R^4$ may be the same or different, and represent an alkyl group; and $R^3$ and $R^4$ may be bonded to each other to form a cycloalkyl ring.

2. A photo-sensitive and heat-sensitive recording material according to claim 1, wherein the coupler is a compound represented by the following general formula (2):

$$E^1—CH_2—E^2 \qquad \text{General formula (2)}$$

wherein, $E^1$ and $E^2$ each independently represents an electron attractive group; and $E^1$ and $E^2$ may be bonded to each other to form a ring.

3. A photo-sensitive and heat-sensitive recording material according to claim 1, wherein a capsule wall of the microcapsule enclosing the diazo compound contains a polyurethane and/or polyurea as a constituent component.

4. A photo-sensitive and heat-sensitive recording material according to claim 2, wherein a capsule wall of the microcapsule enclosing the diazo compound contains a polyurethane and/or polyurea as a constituent component.

5. A photo-sensitive and heat-sensitive recording material according to claim 1, wherein the contained amount of said diazo compound is of from 0.02 to 5 $g/m^2$.

6. A photo-sensitive and heat-sensitive recording material according to claim 2, wherein the contained amount of said diazo compound is of from 0.02 to 5 $g/m^2$.

7. A photo-sensitive and heat-sensitive recording material according to claim 1, wherein the amount of said coupler based on 1 part by weight of said diazo compound is of from 0.1 to 30 parts by weight.

8. A photo-sensitive and heat-sensitive recording material according to claim 2, wherein the amount of said coupler based on 1 part by weight of said diazo compound is of from 0.1 to 30 parts by weight.

9. A photo-sensitive and heat-sensitive recording material according to claim 1, wherein said diazo compound is any of the following compounds:

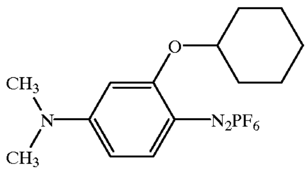

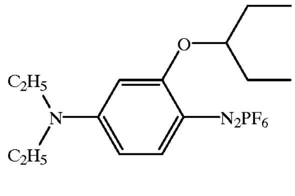

-continued
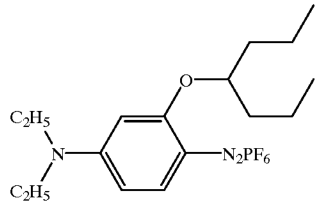
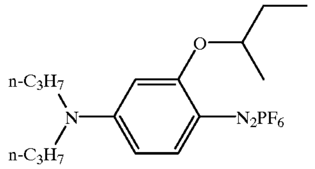
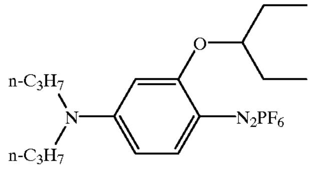
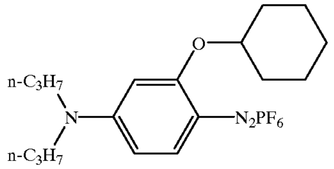
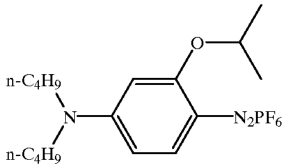
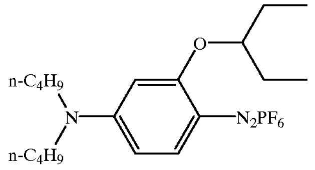
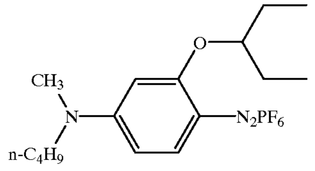
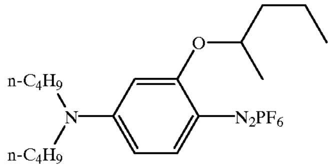
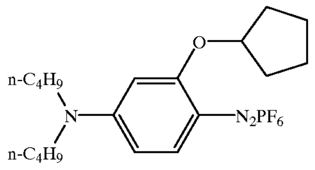
-continued
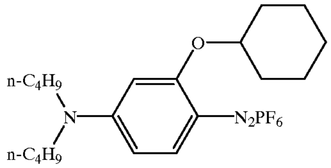
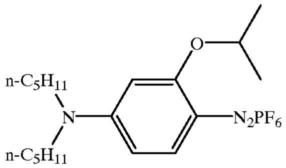
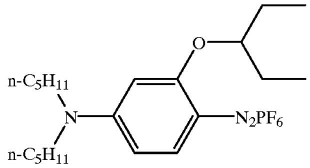
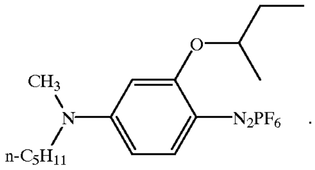
.
10. A photo-sensitive and heat-sensitive recording material according to claim 2, wherein said diazo compound is any of the following compounds:
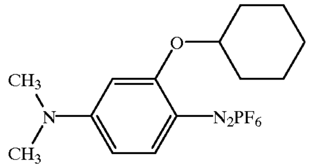
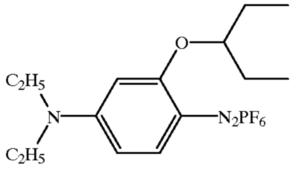
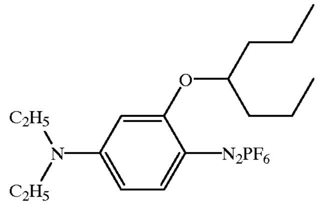
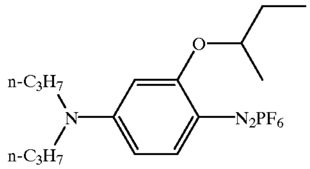

-continued
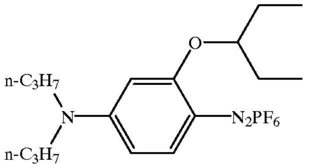
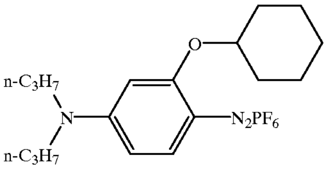
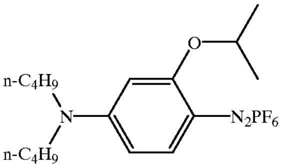
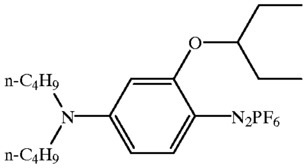
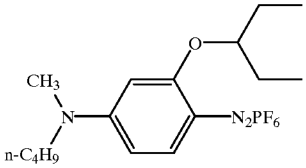
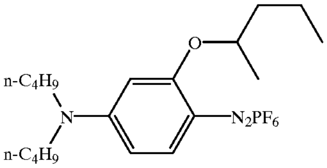
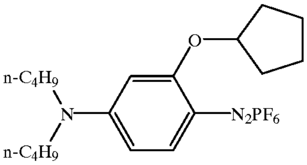
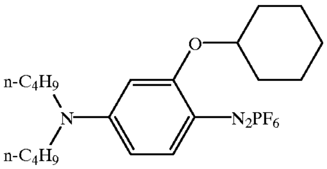
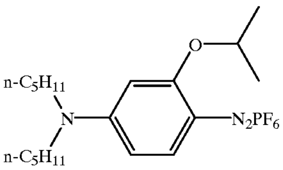
-continued
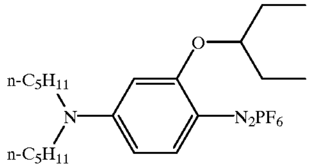
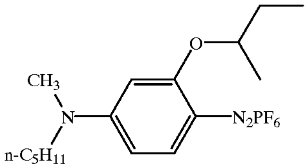
.
11. A photo-sensitive and heat-sensitive recording material according to claim 9, wherein said coupler is any of the following compounds:
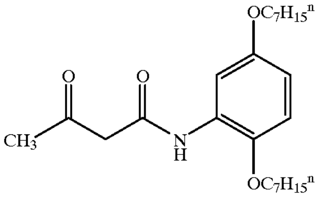
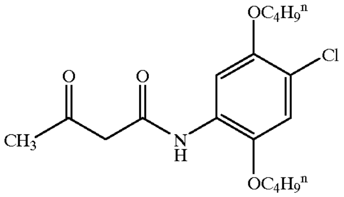
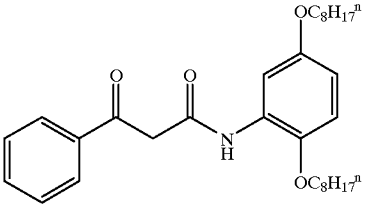
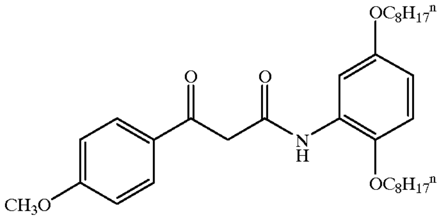
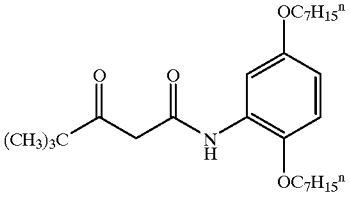

-continued
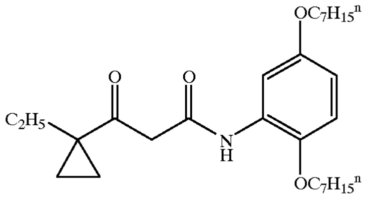
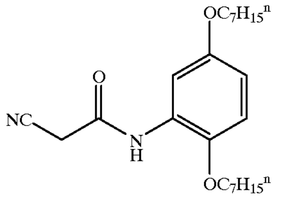
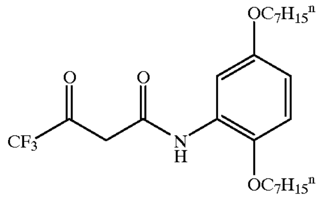
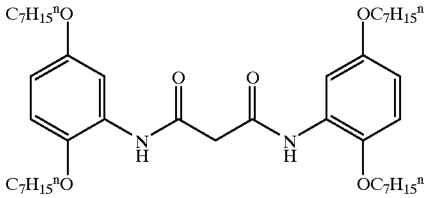
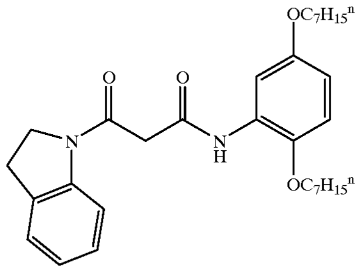
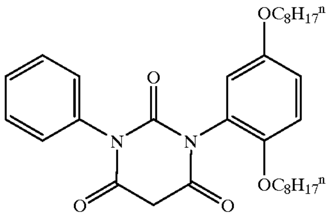
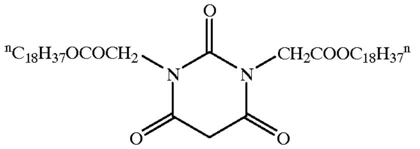
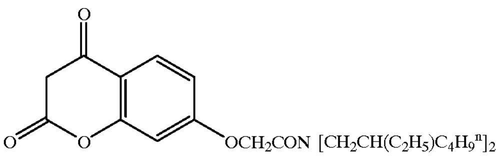
-continued
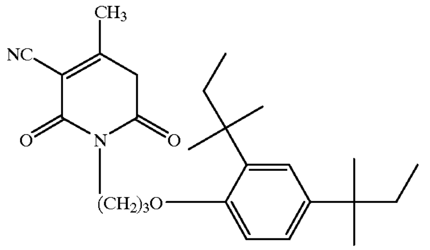
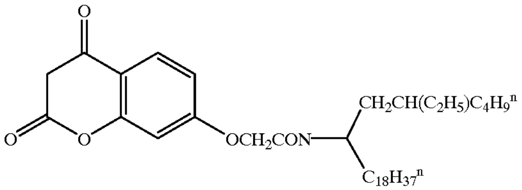
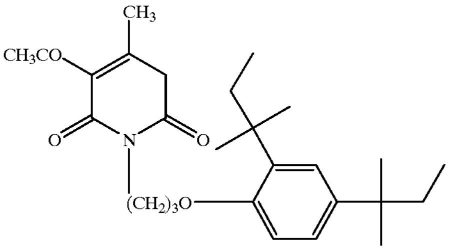
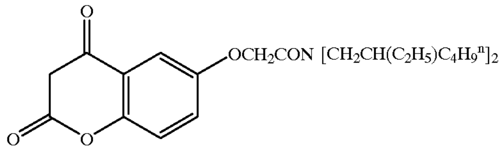
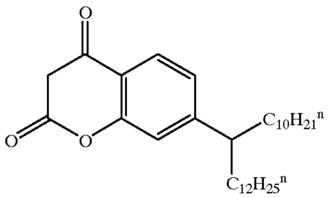
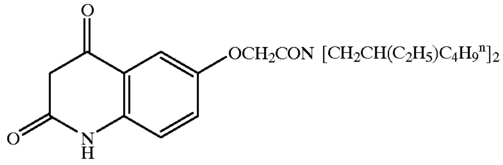
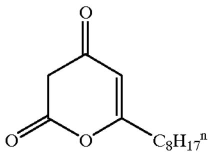
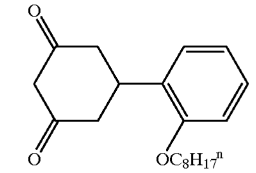

-continued
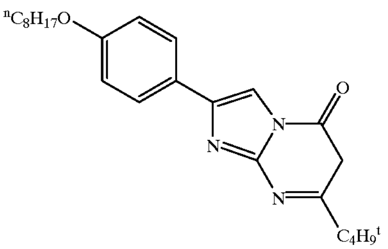
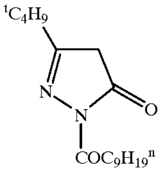
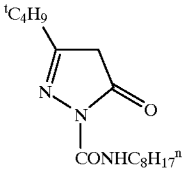
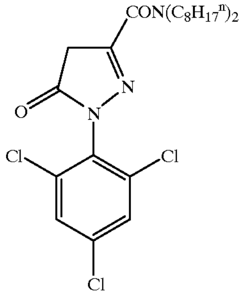
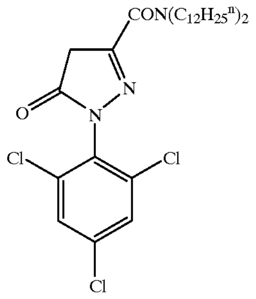
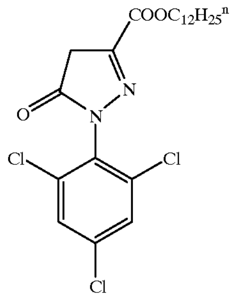
-continued
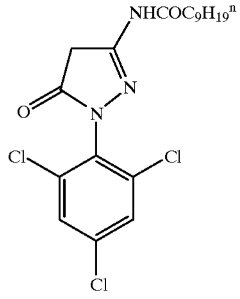
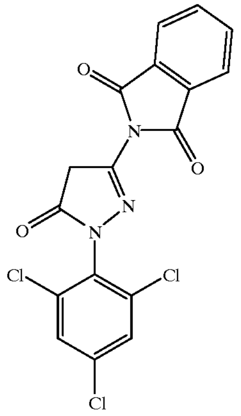
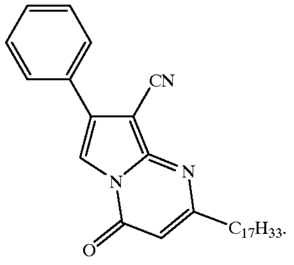
12. A photo-sensitive and heat-sensitive recording material according to claim 10, wherein said coupler is any of the following compounds:
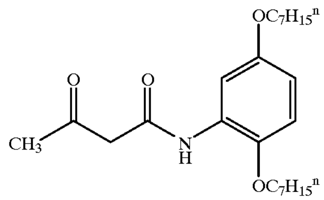
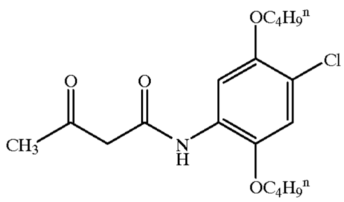

-continued
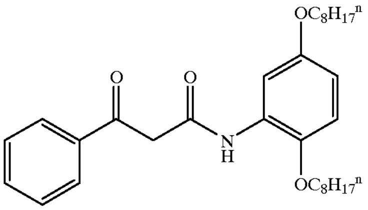
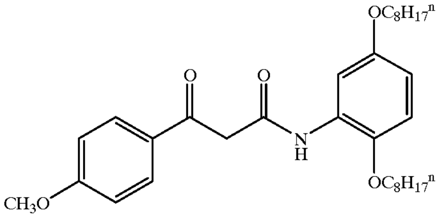
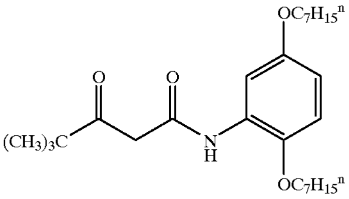
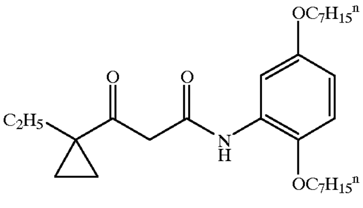
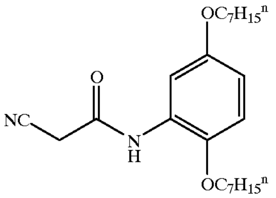
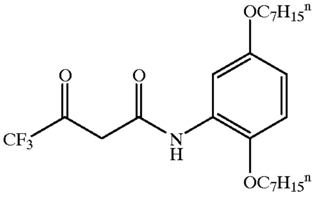
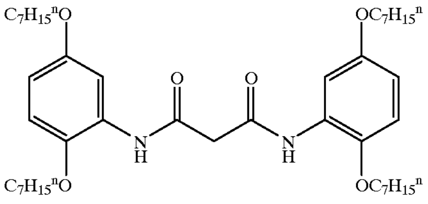
-continued
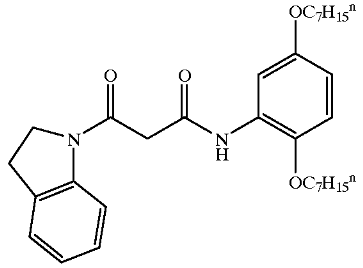
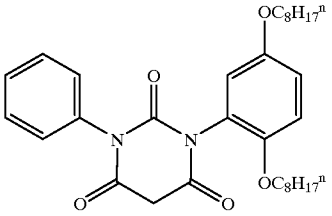
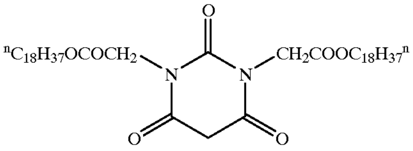
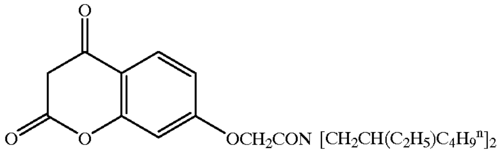
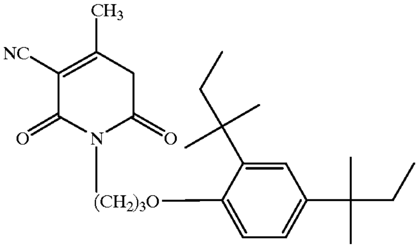
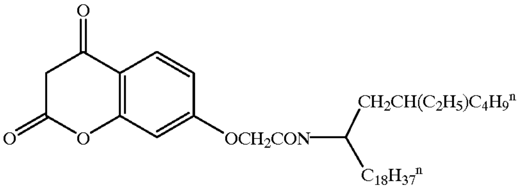
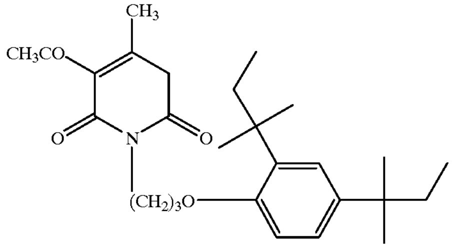
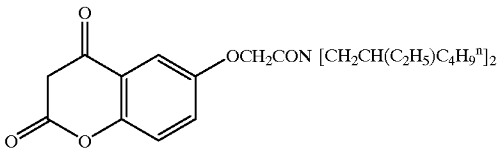

-continued
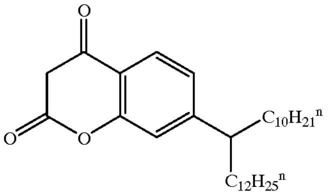
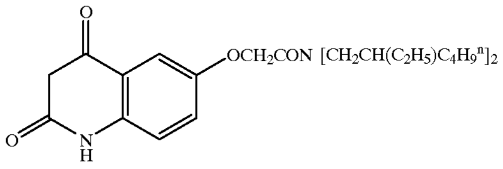
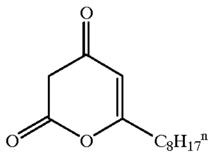
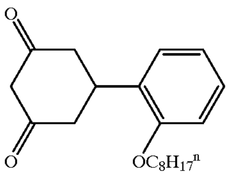
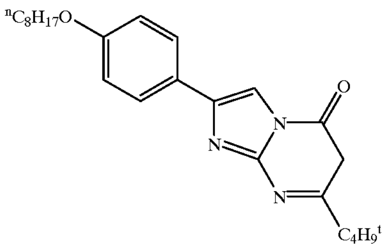
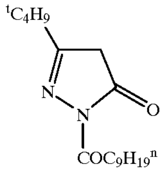
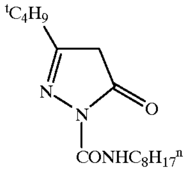
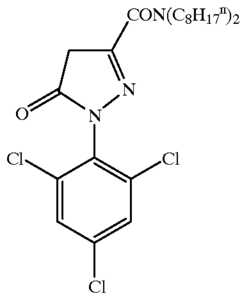
-continued
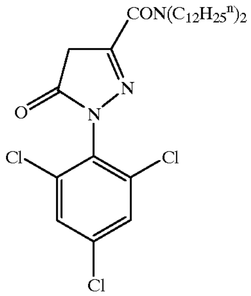
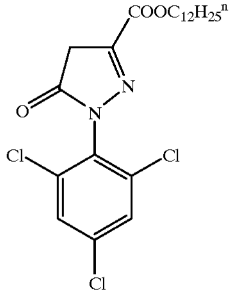
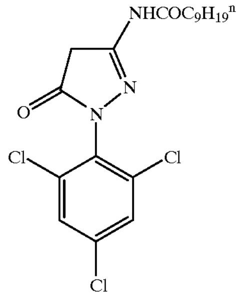
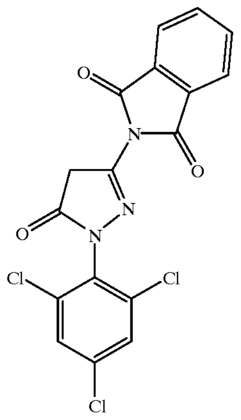
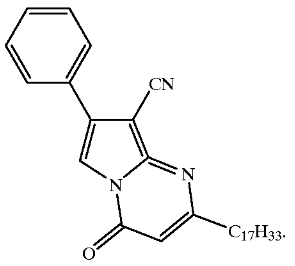
* * * * *